(12) United States Patent
Okamoto

(10) Patent No.: US 6,393,084 B2
(45) Date of Patent: May 21, 2002

(54) CLOCK RECOVERY CIRCUIT

(75) Inventor: Kouji Okamoto, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 8 days.

(21) Appl. No.: 09/734,183

(22) Filed: Dec. 12, 2000

(30) Foreign Application Priority Data

Dec. 13, 1999 (JP) ............................................ 11-353005

(51) Int. Cl.$^7$ ................................................ H03D 3/24
(52) U.S. Cl. ......................... 375/376; 331/25; 327/156
(58) Field of Search .......................... 375/376; 331/17, 331/25; 327/156, 159, 147, 150

(56) References Cited

U.S. PATENT DOCUMENTS

| | | | | |
|---|---|---|---|---|
| 5,774,512 A | * | 6/1998 | Bhatt ......................... | 375/376 |
| 5,987,085 A | * | 11/1999 | Anderson .................... | 375/376 |
| 6,018,556 A | * | 1/2000 | Janesch et al. ............. | 375/376 |

FOREIGN PATENT DOCUMENTS

| | | |
|---|---|---|
| JP | 9-153262 | 6/1997 |
| JP | 10-200396 | 7/1998 |

OTHER PUBLICATIONS

"Timing Recovery in Digital Synchronous Data Receivers" by Mueller et al., IEEE Transactions on Communications, vol. COM–24, No. 5, May 1976, pp. 516–531.

* cited by examiner

Primary Examiner—Temesghen Ghebretinsae
(74) Attorney, Agent, or Firm—McDermott, Will & Emery

(57) ABSTRACT

An oscillating clock frequency of a VFO (variable frequency oscillator) is controlled, using the results of addition of an output from a constant multiplier and an output from an accumulator, which is a result of accumulation of outputs from another constant multiplier, based on a phase error signal by setting the output from an enable-provided latch to 0 during a frequency pull-in operation. A control signal generating portion outputs a pulse at the Hi level as a control signal when completion of frequency pull-in is detected. The latch stores the output from the constant multiplier at the time when the control signal is supplied. Thus, a phase pull-in operation is started in the state where a latch output representing a frequency correction component is obtained. During the phase pull-in operation, the VFO is controlled using the result of addition of an output from the multiplier, an output from the accumulator and an output from the latch. Thus, high speed phase pull-in can be achieved, for example, in reproducing data signal recorded in a recording medium.

14 Claims, 13 Drawing Sheets

CLOCK RECOVERY CIRCUIT

BACKGROUND OF THE INVENTION

The present invention relates to a clock recovery circuit for reproducing a clock signal synchronized with an input signal quantized to a digital value from the input signal.

In a data reproducing apparatus for decoding a data signal recorded in a recording medium such as an optical disk and a magnetic disk, in order to identify a reproduction signal from the recording medium as data, it is necessary to recover a clock signal synchronized with this reproduction signal from the reproduction signal.

In general, a clock recovery circuit in a digital system includes a phase comparator, a loop filter, a D/A converter and a VFO (variable frequency oscillator). The VFO generates an oscillating clock signal of a variable frequency under control of an analog voltage. The phase comparator computes a digital value representing a phase error of the oscillating clock signal with respect to an input signal quantized to a digital value and outputs a phase error signal in a digital system as described, for example, in K. H. Mueller et al., "Timing Recovery in Digital Synchronous Data Receivers", IEEE Transactions on Communications, Vol. COM-24, No. 5, pp. 516–531, May 1976. The loop filter is a circuit block for smoothing a digital output from the phase comparator and outputting the smoothed digital output. The D/A converter converts the digital output from the loop filter to an analog voltage so as to control generation of the oscillating clock signal so that the phase error is zero, and supplies the analog voltage to the VFO.

FIG. 17 shows an example of the configuration of a conventional loop filter. In FIG. 17, reference numeral 31 and 32 denote first and second constant multipliers, reference numeral 34 denotes an accumulator, and reference numeral 35 denotes an adder. The first constant multiplier 31 outputs a result obtained by multiplying a phase error signal E output from the phase comparator by a constant filter coefficient α. The second constant multiplier 32 outputs a result obtained by multiplying the phase error signal E by a constant filter coefficient β (<α). The accumulator 34 outputs a result obtained by accumulating outputs H from the second constant multiplier 32, and includes an adder 91 and a latch 92. The adder 35 adds an output G from the first constant multiplier 31 and an output Y from the accumulator 34. A digital value representing the result of this addition, namely, a filter output Z, is supplied to the VFO via the D/A converter.

FIG. 18 shows an example of a waveform of each portion of the loop filter of FIG. 17 when the clock recovery circuit is operated. A frequency pull-in operation is performed for a period during which a frequency error is contained in an oscillating clock signal of the VFO. When the frequency pull-in is completed, a phase pull-in operation is started. In the example of FIG. 18, a frequency pull-in is completed and a phase pull-in operation is started in cycle 7, and the phase pull-in is completed in cycle 46. In the frequency lock state around cycle 7, E=14 (constant), and G=5, Y=1, and Z=6. The output G (=5) from the first multiplier 31 represents a frequency correction component. In the phase lock state after cycle 46, E=0, and G=0, Y=4, and Z=4. In this case, the unit of these examples of the values is arbitrary.

According to the conventional loop filter shown in FIG. 17, during a period from the start of the phase pull-in operation to the completion of the phase pull-in, a main portion of the filter output Z (=G+Y) has to shift from the output G from the first multiplier 31 to the output Y from the accumulator 34. In the specific example of FIG. 18, during this period, the output G from the first multiplier 31 changes from 5 to 0, whereas the output Y from the accumulator 34 changes 1 to 4. However, since the filter coefficient β is set to small for stable operation of the clock recovery circuit, the change of the output Y from the accumulator 34 is slow. Therefore, in the example of FIG. 18, the start of the phase pull-in operation to the completion of the pull-in takes as long a time as 39 clock cycles.

SUMMARY OF THE INVENTION

It is an object of the present invention to provide a clock recovery circuit that can achieve high-speed phase pull-in.

In order to achieve this object, a first clock recovery circuit of the present invention includes a loop filter including first and second multipliers for multiplying a digital output from a phase comparator by respective filter coefficients and outputting the results; a control signal generating portion for outputting a control signal at the time when completion of frequency pull-in is detected based on the digital output from the phase comparator; an enable-provided latch for outputting a constant value 0 for a period during which the control signal is not output, and after the control signal is output, storing the output from the first multiplier at the time when the control signal is output, and outputting the same; an accumulator for accumulating outputs from the second multiplier and outputting a result; and an adder for supplying a digital value representing a result of addition of the output from the first multiplier, the output from the enable-provided latch, and the output from the accumulator as a filter output, wherein a phase pull-in operation is started using the stored value of the output from the first multiplier at the time of completion of the frequency pull-in.

According to the first clock recovery circuit, since the output from the enable-provided latch is 0 during the frequency pull-in operation, the sum of the output from the first multiplier and the output from the accumulator is the filter output as in the conventional example. However, when frequency pull-in is completed, and a frequency lock state is reached, the output from the first multiplier at the time of completion of the frequency pull-in is stored in the enable-provided latch. Thus, a phase pull-in operation is started in the state where a frequency correction component is stored collectively in the latch that is discrete from the accumulator. Then, during a phase pull-in operation, the sum of the output from the first multiplier, the output from the enable-provided latch, and the output from the accumulator is the filter output. Therefore, high speed phase pull-in can be attained.

A second clock recovery circuit includes a loop filter including a control signal generating portion for outputting a control signal at the time when completion of frequency pull-in is detected based on the digital output from the phase comparator; a multiplier for outputting a result obtained by multiplying the digital output from the phase comparator by a first filter coefficient for a period during which the control signal is not output, and after the control signal is output, multiplying the digital output from the phase comparator by a second filter coefficient; an enable-provided accumulator for accumulating a constant value 0 for a period during which the control signal is not output, and accumulating outputs from the multiplier after the control signal is output and outputting a result; and an adder for supplying a digital value representing a result of addition of the output from the multiplier and the output of the enable-provided accumulator as a filter output, wherein a phase pull-in operation is started using a stored value of the output from the multiplier at the time of completion of the frequency pull-in.

According to the second clock recovery circuit, since the output from the enable-provided accumulator is 0 during the frequency pull-in operation, the filter output depends only on the output from the multiplier having a first filter coefficient as the multiplier factor. When the frequency pull-in is completed and a frequency lock state is reached, the output from the multiplier at the time of completion of the frequency pull-in is stored in the enable-provided accumulator and accumulation is started. Thus, a phase pull-in operation is started in the state where a frequency correction component is stored collectively in the enable-provided accumulator. Then, during a phase pull-in operation, the sum of the output from the multiplier having a second filter coefficient as the multiplier factor and the output from the enable-provided accumulator is the filter output. Therefore, high speed phase pull-in can be attained.

As described above, the present invention can provide a clock recovery circuit that can achieve high speed phase pull-in by using a loop filter having an enable-provided latch or an enable-provided accumulator, and starting a phase pull-in operation using the stored value of the output from the multiplier at the time of completion of the frequency pull-in.

This and other advantages of the present invention will become apparent to those skilled in the art upon reading and understanding the following detailed description with reference to the accompanying figures.

DETAILED DESCRIPTION OF THE INVENTION

Hereinafter, embodiments of the present invention will be described with reference to the accompanying drawings.

Figure 1:
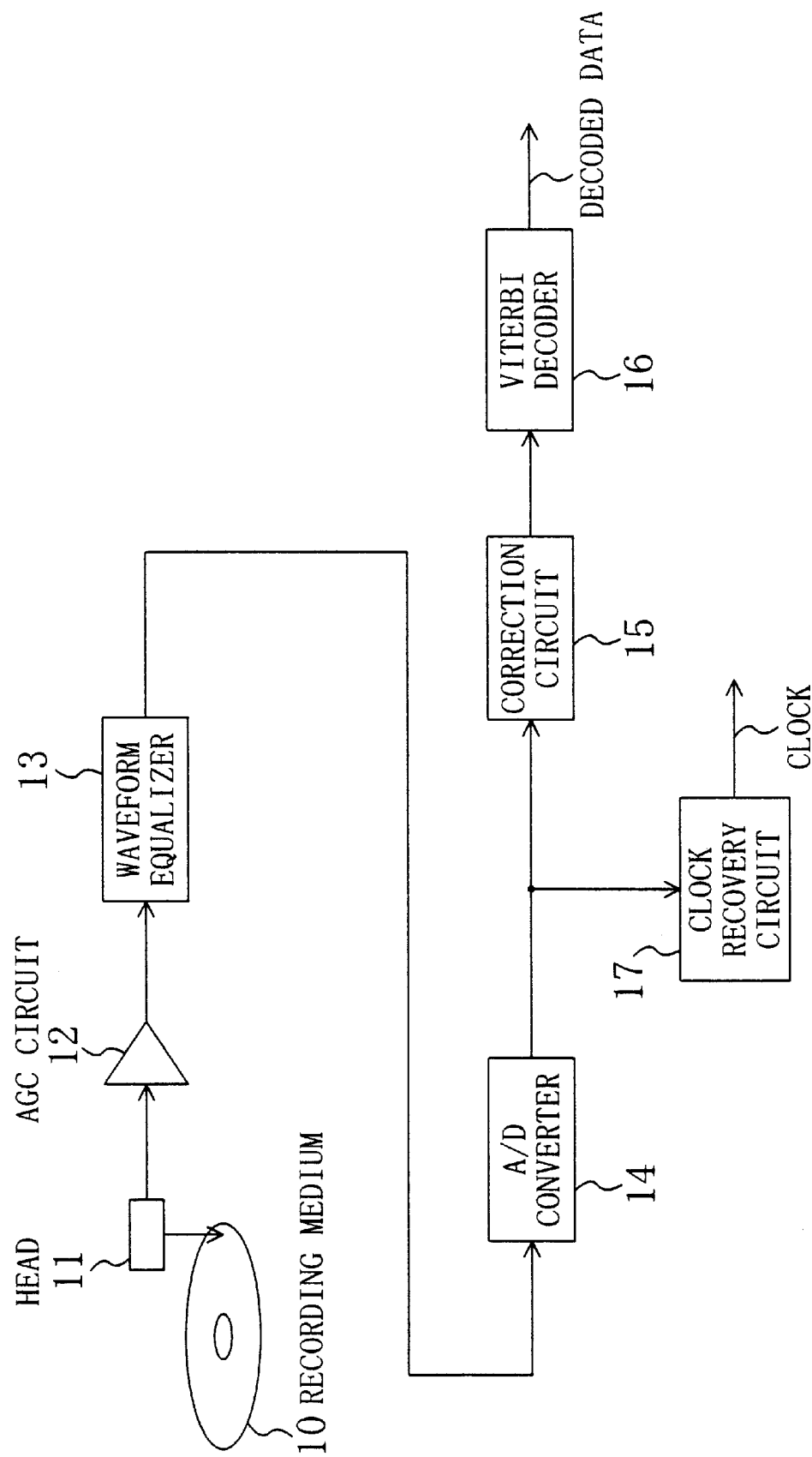
FIG. 1 is a block diagram showing an example of the configuration of a reproduction system signal processing circuit in a data recording/reproducing apparatus utilizing a clock recovery circuit according to the present invention.

FIG. 1 shows an example of the configuration of a reproducing system signal processing circuit in a data recording/reproducing apparatus utilizing a clock recovery circuit according to the present invention. In FIG. 1, reference numeral 10 denotes a recording medium, reference numeral 11 denotes a head, reference numeral 12 denotes an AGC circuit for amplitude correction of a reproduction signal, reference numeral 13 denotes a waveform equalizer, reference numeral 14 denotes an A/D converter, reference numeral 15 denotes a correction circuit for waveform correction in the digital manner, reference numeral 16 denotes a Viterbi decoder, and reference numeral 17 denotes a clock recovery circuit according to the present invention.

A data signal recorded in the recording medium 10 is converted to an analog reproduction signal by the head 11. The amplitude of this reproduction signal is corrected by the AGC circuit 12, and then the reproduction signal is subjected to waveform equalization processing corresponding to the characteristics of the Viterbi decoder 16 by the waveform equalizer 13. The waveform-equalized reproduction signal is quantized by the A/D converter 14, waveform corrected in the digital manner by the correction circuit 15, and then converted to decoded data by the Viterbi decoder 16. The reproduction signal quantized by the A/D converter 14 is input also to the clock recovery circuit 17. The clock recovery circuit 17 recovers a clock signal synchronized with this input signal from the input signal. An output clock (recovered clock) from the clock recovery circuit 17 is used as a sampling clock for quantization in the A/D converter 14, and used as a system clock in digital portions such as the correction circuit 15, the Viterbi decoder 16 or the like.

Figure 2:
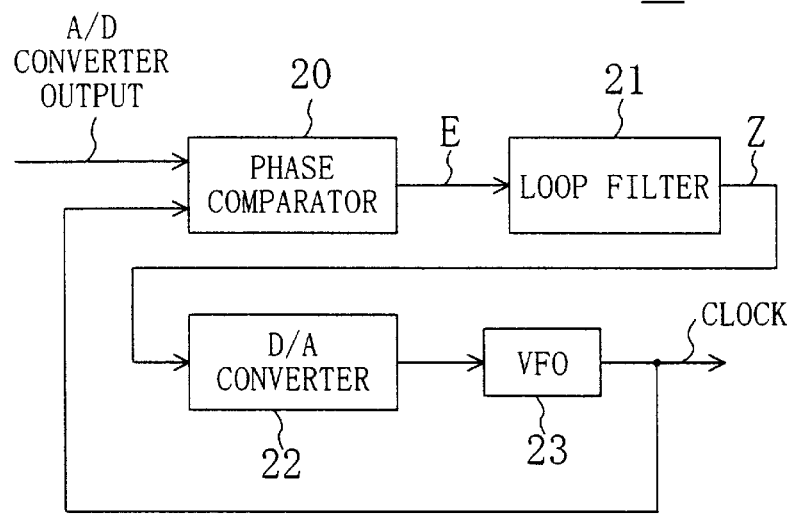
FIG. 2 is a block diagram showing an example of the configuration of the clock recovery circuit in FIG. 1.

FIG. 2 shows an example of the configuration of the clock recovery circuit 17 in FIG. 1. In FIG. 2, reference numeral 20 denotes a phase comparator, reference numeral 21 denotes a loop filter, reference numeral 22 denotes a D/A converter, and reference numeral 23 denotes a VFO (variable frequency oscillator). The VFO 23 generates an oscillating clock signal of a variable frequency under control of an analog voltage. The phase comparator 20 computes a digital value representing a phase error of the oscillating clock signal (sampling clock) with respect to an output signal (output sample) from the A/D converter 14. The loop filter 21 is a circuit block for smoothing the digital output from the phase comparator 20, namely, a phase error signal E, and outputting the smoothed signal. The D/A converter 22 converts the digital output Z from the loop filter 21 to an analog voltage so as to control generation of the oscillating clock signal so that the phase error is zero, and supplies the analog voltage to the VFO 23. The oscillating clock signal from the VFO 23 is also used as a clock signal for synchronous operation of the loop filter 21 and the D/A converter 22.

Hereinafter, first to sixth examples of the configuration of the loop filter 21 in the FIG. 2 will be described.

First Configuration Example

Figure 3:
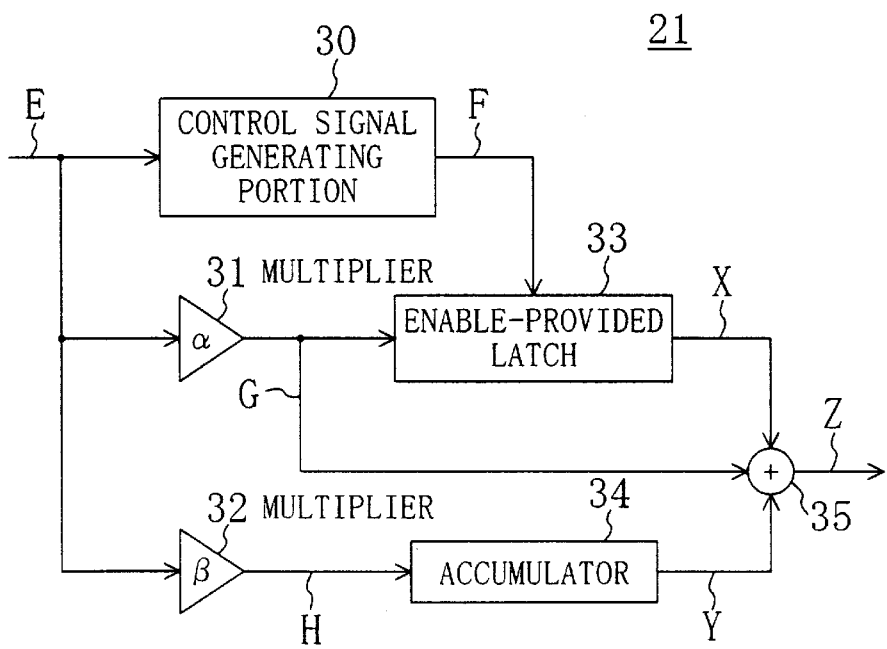
FIG. 3 is a block diagram showing a first example of the configuration of the loop filter in FIG. 2.

FIG. 3 shows a first configuration example of the loop filter 21 in the FIG. 2. In FIG. 3, reference numeral 30 denotes a control signal generating portion, reference numerals 31 and 32 denote first and second constant multipliers, reference numeral 33 denotes an enable-provided latch, reference numeral 34 denotes an accumulator, and reference numeral 35 denotes is an adder. The control signal generating portion 30 outputs a pulse at Hi (high) level as a control signal F for one clock cycle at the time when the completion of frequency pull-in is detected based on a phase error signal E output from the phase comparator 20. The first constant multiplier 31 outputs a result obtained by multiplying the phase error signal E by a constant filter coefficient α. The second constant multiplier 32 outputs a result obtained by multiplying the phase error signal E by a constant filter coefficient β (<α). The enable-provided latch 33 outputs a constant value 0 for a period during which the control signal F is not output, and after the control signal F is output, the enable-provided latch 33 stores the output G from the first constant multiplier 31 at the time when the control signal F is output, and outputs the same. The accumulator 34 outputs a result obtained by accumulating outputs H from the second constant multiplier 32. The adder 35 adds an output G from the first constant multiplier 31, an output X from the enable-provided latch 33 and an output Y from the accumulator 34. A digital value representing the result of this addition, namely, a filter output Z, is supplied to the VFO 23 via the D/A converter 22. The filter coefficient β of the second constant multiplier 32 is set to sufficiently small, relative to the filter coefficient α of the first constant multiplier 31 for stable operation of the clock reproduction system.

The oscillating clock signal of the VFO 23 in the initial state contains not only a phase error but also a frequency error. When a frequency error is contained in a sampling clock of the A/D converter 14, the sampling point of the A/D converter 14 shifts. In order to eliminate this phenomenon, the clock recovery circuit 17 in FIG. 2 first performs a frequency pull-in operation.

According to the configuration of FIG. 3, during the frequency pull-in operation, the control signal F output from the control signal generating portion 30 is at the Lo (low) level, so that the output X from the enable-provided latch 33 is 0. Assuming that the phase error at an arbitrary time n during the frequency pull-in operation is E(n), the filter output Z is expressed by:

$$Z=X+G+Y=\alpha \times E(n)+\Sigma_{i=0}^{n}\{\beta \times E(i)\}$$

When the frequency pull-in is completed and the frequency lock state (E=constant) is reached, the control signal generating portion 30 outputs a pulse at the Hi level as the control signal F. Assuming that the phase error in this frequency lock state is E(k), the output G from the first constant multiplier 31 is α×E(k) representing a frequency correction component. The enable-provided latch 33 stores the frequency correction component α×E(k) in response to the control signal F and outputs the same. From this point, a phase pull-in operation is started.

Assuming that the phase error at an arbitrary time m during the phase pull-in operation is E(m), the filter output Z is expressed by:

$$Z=X+G+Y=\alpha \times E(k)+\alpha \times E(m)+\Sigma_{i=0}^{m}\{\beta \times E(i)\}$$

In this case, the phase pull-in operation is started, using the frequency correction component collectively stored in the enable-provided latch 33, which is discrete from the accumulator 34, so that high-speed phase pull-in can be attained.

Figure 4:
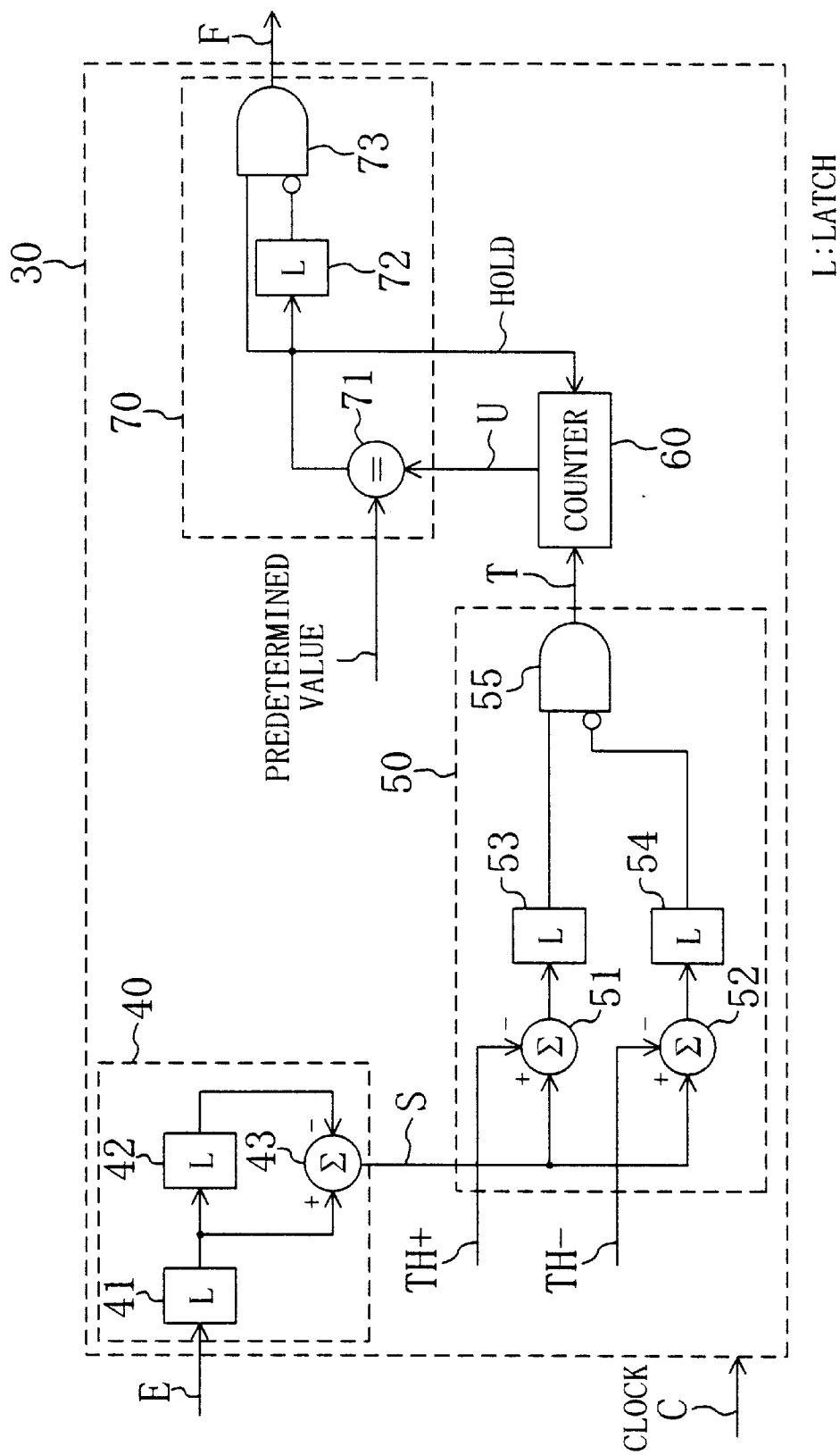
FIG. 4 is a circuit diagram showing the control signal generating portion in FIG. 3 in detail.

FIG. 4 shows a configuration example of the control signal generating portion 30 in FIG. 3 in detail. In FIG. 4, reference numeral 40 denotes a difference calculator, reference numeral 50 denotes a window comparator, reference numeral 60 denotes a counter, and reference numeral 70 denotes a pulse generator. The difference calculator 40 calculates a change in the phase error signal E and outputs a phase error difference signal S and includes two latches 41 and 42 and a subtractor 43. The window comparator 50 outputs a count signal T at the Hi level when the difference S of the phase error is in a certain range defined by a positive threshold (TH+) and a negative threshold (TH−) and includes two subtractors 51 and 52, two latches 53 and 54 and a logic gate 55. The counter 60 counts the count signal T at the Hi level supplied from the window comparator 50. The pulse generator 70 generates a pulse signal upon determination that the frequency pull-in has been completed at the time when the output U from the counter 60 reaches a predetermined value, and outputs the generated pulse signal as the control signal F. The pulse generator 70 includes a comparator 71, a latch 72 and a logic gate 73. The output from the comparator 71 that turns to the Hi level when the output U from the counter 60 corresponds to the predetermined value is supplied to the counter 60 as a hold signal. The control signal generating portion 30 of FIG. 4 is configured so as to operate in synchronization with the supplied clock signal C.

Figure 5:
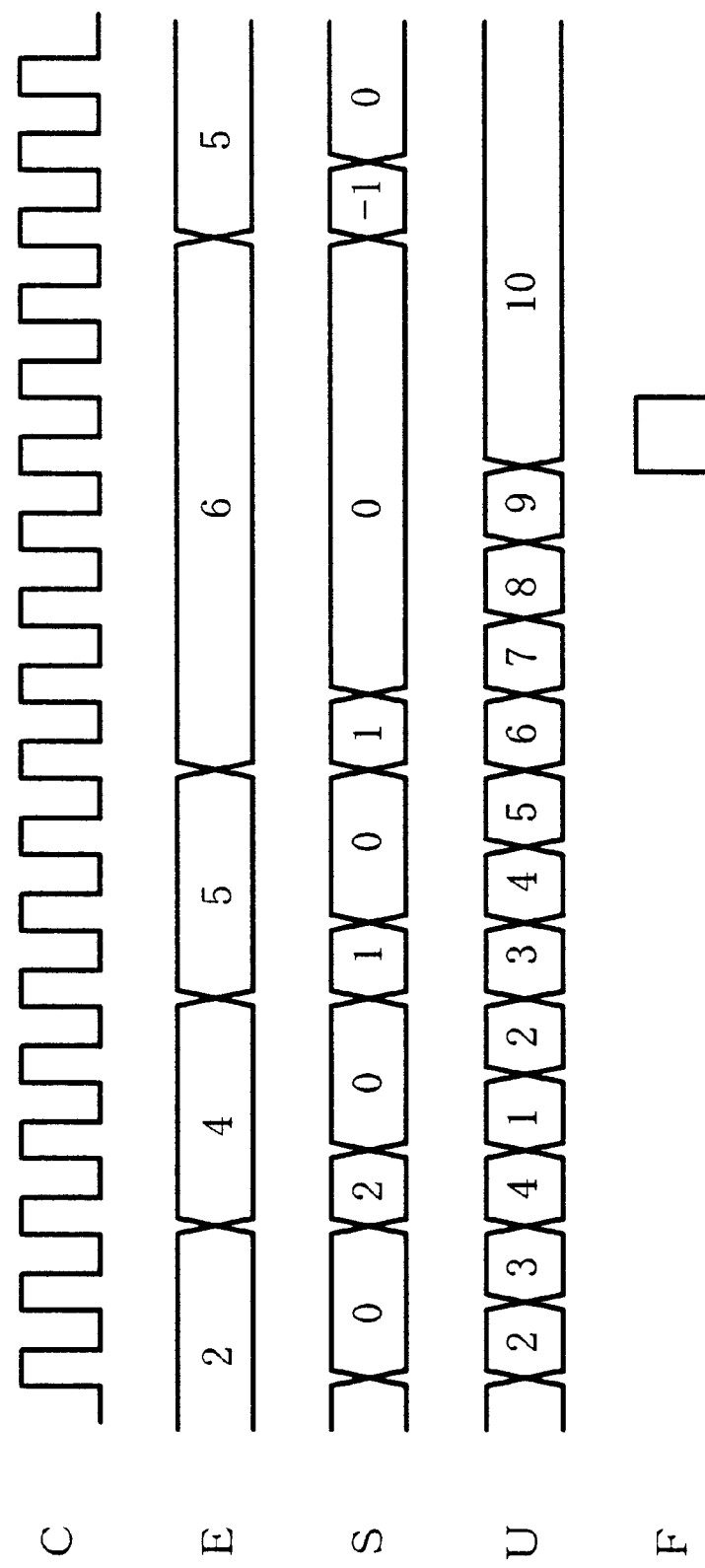
FIG. 5 is a timing chart diagram showing an example of the operation of the control signal generating portion in FIG. 4.

FIG. 5 shows an example of the operation of the control signal generating portion 30 of FIG. 4. Herein, it is assumed that the positive and negative thresholds (TH+ and TH−) is +1 and −1, respectively, and the predetermined value of the comparator 71 is 10. In this case, the control signal generating portion 30 outputs a pulse at the Hi level as the control signal F for one clock cycle upon determination that the frequency pull-in has been completed at the end of consecutive 10 clock cycles during which the difference S of the phase error is −1, 0 or +1.

Second Configuration Example

Figure 6:
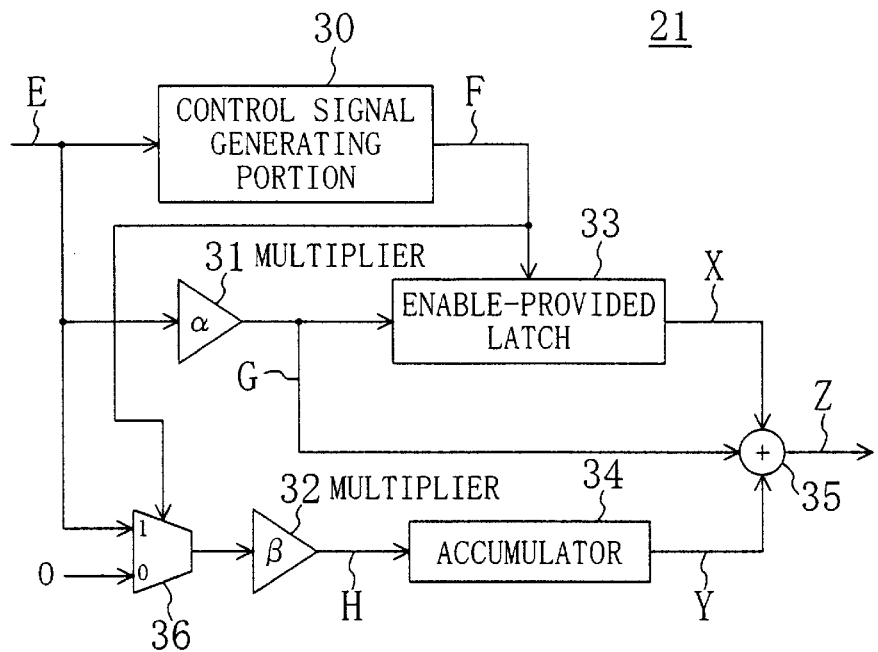
FIG. 6 is a block diagram showing a second example of the configuration of the loop filter in FIG. 2.

FIG. 6 shows a second configuration example of the loop filter 21 in the FIG. 2. The configuration in FIG. 6 is different from that in FIG. 3 in that a selector 36 is added. The selector 36 outputs a constant value 0 for a period during which the control signal F is not output, and after the control signal F is output, the selector 36 supplies the phase error signal E to the second constant multiplier 32.

According to the configuration of FIG. 6, during the frequency pull-in operation, the control signal F output from the control signal generating portion 30 is at the Lo level, so that the output X from the enable-provided latch 33 is 0. In addition, since the selector 36 selects the constant value 0, the output H from the second constant multiplier 32 and thus the output Y from the accumulator 34 are 0 as well. Consequently, assuming that the phase error at an arbitrary time n during the frequency pull-in operation is E(n), the filter output Z is expressed by:

$$Z=X+G+Y=\alpha \times E(n)$$

When the frequency pull-in is completed and the frequency lock state (E=constant) is reached, the control signal generating portion 30 outputs a pulse at the Hi level as the control signal F. Assuming that the phase error in this frequency lock state is E(k), the output G from the first constant multiplier 31 is α×E(k) representing a frequency correction component. The enable-provided latch 33 stores the frequency correction component α×E(k) in response to the control signal F and outputs the same. On the other hand, the selector 36 starts to supply the phase error signal E to the second constant multiplier 32. From this point, a phase pull-in operation is started.

Assuming that the phase error at an arbitrary time m during the phase pull-in operation is E(m), the filter output Z is expressed by:

$$Z=X+G+Y=\alpha\times E(k)+\alpha\times E(m)+\Sigma_{i=k+1}^{m}\{\beta\times E(i)\}$$

In this case, the phase pull-in operation is started, using the frequency correction component collectively stored in the enable-provided latch 33, which is discrete from the accumulator 34, so that high-speed phase pull-in can be attained.

Figure 7:
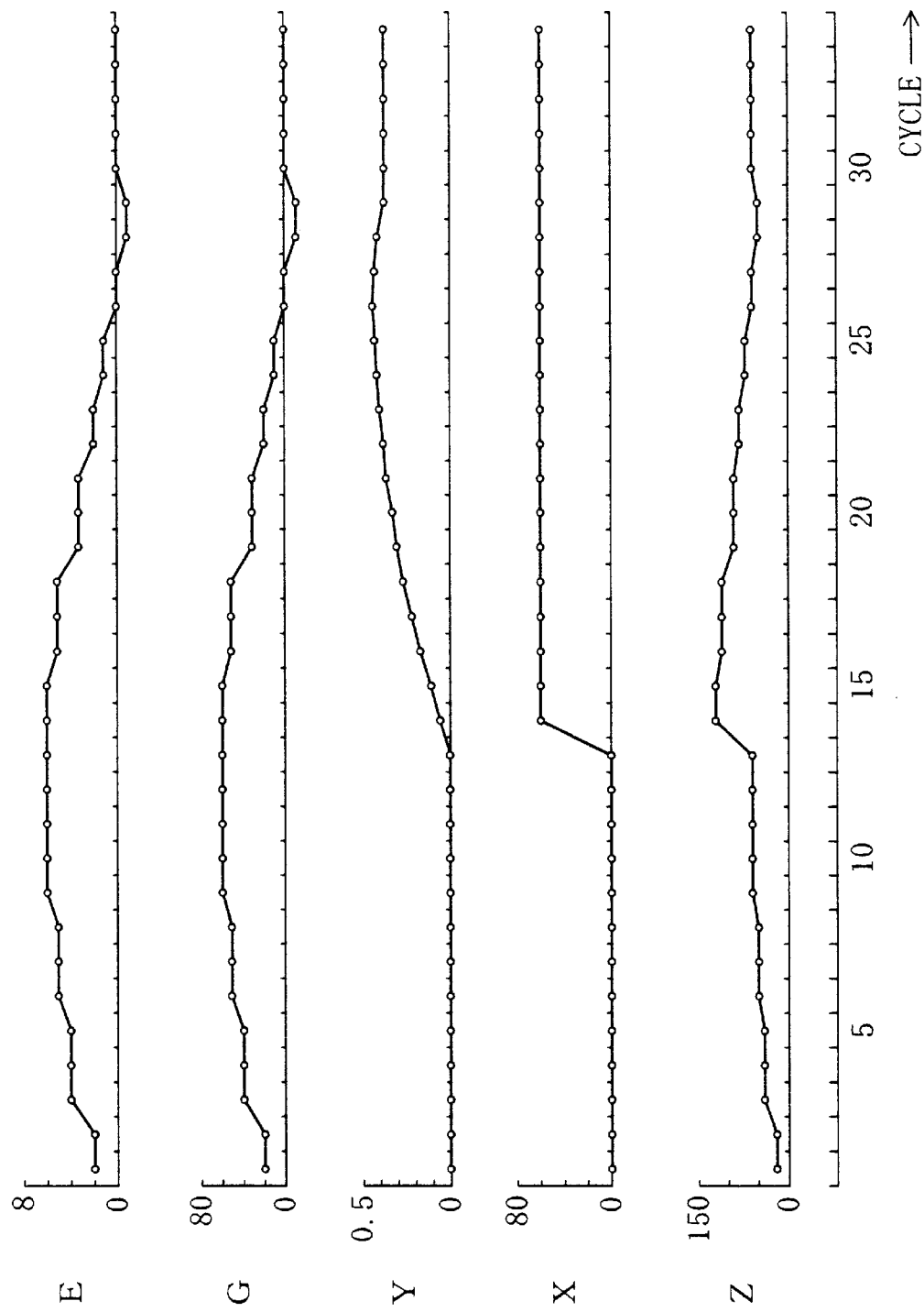
FIG. 7 is a waveform diagram showing an example of the operation of the loop filter in FIG. 6.

FIG. 7 shows an example of a waveform of each portion of the loop filter 21 of FIG. 6 when the clock recovery circuit 17 is operated. In this example, a frequency pull-in is completed and a phase pull-in operation is started in cycle 13, and the phase pull-in is completed in cycle 30. In the frequency lock state around cycle 13, E=6 (constant), and G=60, Y=0, X=0 and Z=60. The output G (=60) from the first multiplier 31 represents a frequency correction component. In the phase lock state after cycle 30, E=0, and G=0, Y=0.4, X=60 and Z=60.4. In this case, the unit of these examples of the values is arbitrary.

According to FIG. 7, the frequency correction component G in the frequency lock state is turned to the latch output X immediately at the time of the start of the phase pull-in operation. Therefore, although the filter coefficient β is set to small, the phase pull-in is completed as quick as in 17 clock cycles from the start of the phase pull-in operation. Thus, high-speed pull-in can be attained.

Third Configuration Example

Figure 8:
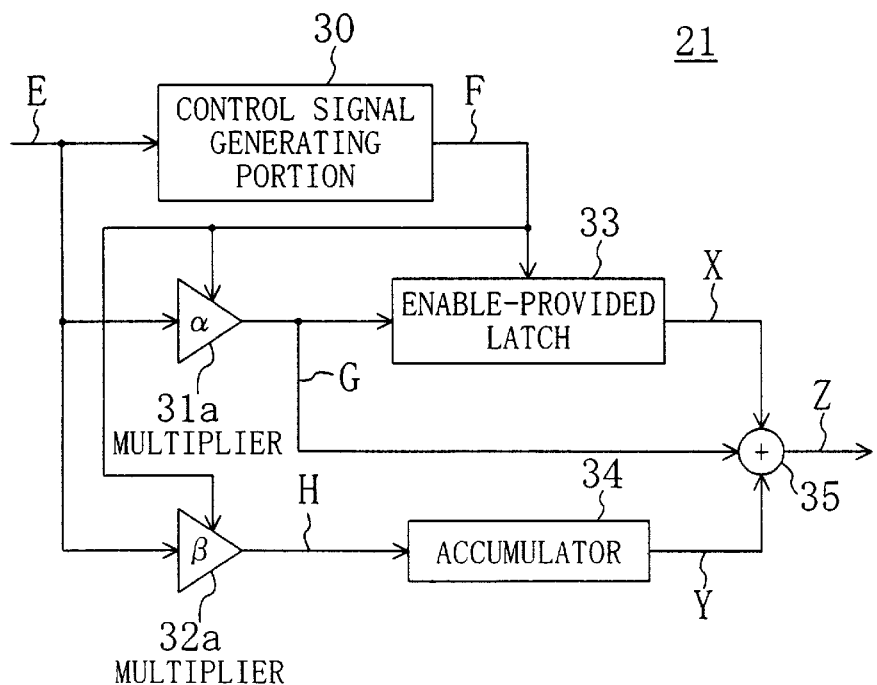
FIG. 8 is a block diagram showing a third example of the configuration of the loop filter in FIG. 2.

FIG. 8 shows a third configuration example of the loop filter 21 in the FIG. 2. The configuration in FIG. 8 is different from that in FIG. 3 in that the constant multipliers 31 and 32 in FIG. 3 are replaced by the multiplier-factor-variable multipliers 31a and 32a. The first multiplier-factor-variable multiplier 31a is configured so as to multiply the phase error signal E by a first filter coefficient α1 for a period during which the control signal F is not output, and multiply the phase error signal E by a second filter coefficient α2 after the control signal F is output. Similarly, the second multiplier-factor-variable multiplier 32a is configured so as to multiply the phase error signal E by a first filter coefficient β1 for a period during which the control signal F is not output, and multiply the phase error signal E by a second filter coefficient β2 after the control signal F is output. This configuration makes it possible to set the loop gain for the frequency pull-in independently from the loop gain for the phase pull-in.

Figure 9:
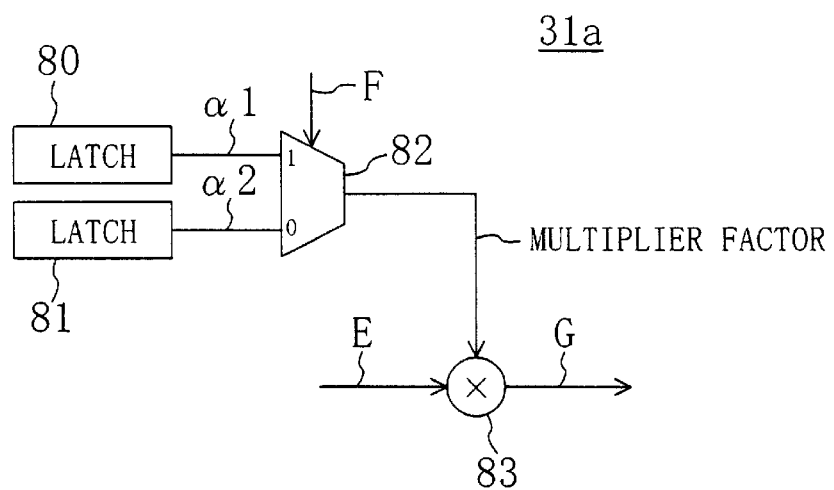
FIG. 9 is a circuit diagram showing the multiplier-factor-variable multiplier in FIG. 8 in detail.

FIG. 9 shows a configuration example of the first multiplier-factor-variable multiplier 31a in FIG. 8. In FIG. 9, reference numeral 80 denotes a latch for storing the first filter coefficient α1 used at the time of the frequency pull-in. Reference numeral 81 denotes a latch for storing the second filter coefficient α2 used at the time of the phase pull-in. Reference numeral 82 denotes a selector for selecting either one of the first and second filter coefficients α1 and α2 as a multiplier factor in accordance with the control signal F. Reference numeral 83 denotes a multiplication unit for multiplying the phase error signal E by the selected multiplier factor. The configuration of the second multiplier-factor-variable multiplier 32a is the same as that of FIG. 9.

According to the configuration of FIG. 8, during the frequency pull-in operation, the control signal F output from the control signal generating portion 30 is at the Lo (low) level, so that the output X from the enable-provided latch 33 is 0. In addition, the multiplier-factor-variable multipliers 31a and 32a select the filter coefficients α1 and β1, respectively. Consequently, assuming that the phase error at an arbitrary time j during the frequency pull-in operation is E(j), the filter output Z is expressed by:

$$Z=X+G+Y=\alpha 1\times E(j)+\Sigma_{n=0}^{j}\{\beta 1\times E(n)\}$$

When the frequency pull-in is completed and the frequency lock state (E=constant) is reached, the control signal generating portion 30 outputs a pulse at the Hi level as the control signal F. Assuming that the phase error in this frequency lock state is E(k), the output G from the first multiplier-factor-variable multiplier 31a is α1×E(k) representing a frequency correction component. The enable-provided latch 33 stores the frequency correction component α1×E(k) in response to the control signal F and outputs the same. On the other hand, the first and second multiplier-factor-variable multipliers 31a and 32a select filter coefficients α2 and β2, respectively, in response to the control signal F. From this point, a phase pull-in operation is started.

Assuming that the phase error at an arbitrary time m during the phase pull-in operation is E(m), the filter output Z is expressed by:

$$Z=X+G+Y=\alpha 1\times E(k)+\alpha 2\times E(m)+\Sigma_{n=0}^{k}\{\beta 1\times E(n)\}+\Sigma_{n=k+1}^{m}\{\beta 2\times E(n)\}$$

In this case, the phase pull-in operation is started, using the frequency correction component α1×E(k) collectively stored in the enable-provided latch 33, which is discrete from the accumulator 34, so that high-speed phase pull-in can be attained.

Fourth Configuration Example

Figure 10:
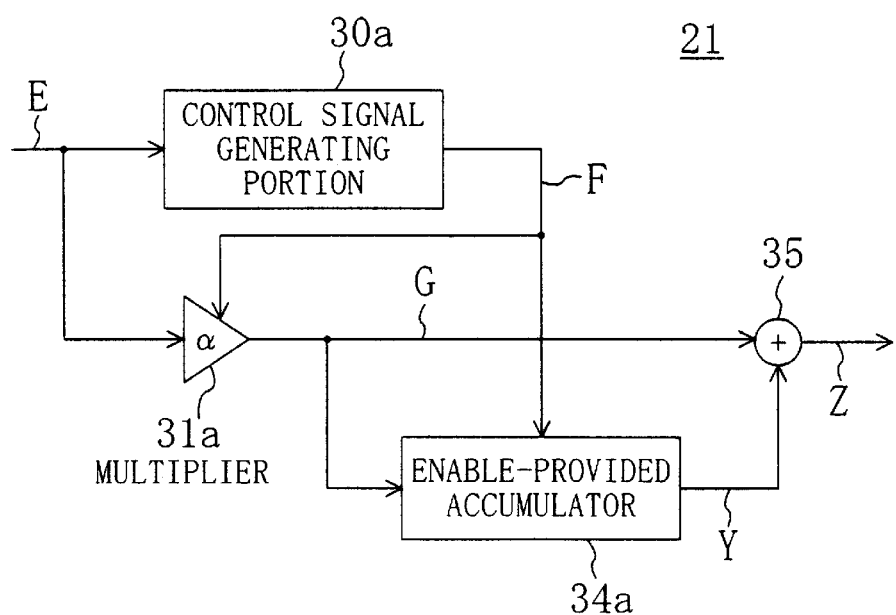
FIG. 10 is a block diagram showing a fourth example of the configuration of the loop filter in FIG. 2.

FIG. 10 shows a fourth configuration example of the loop filter 21 in the FIG. 2. In FIG. 10, Reference numeral 30a denotes a control signal generating portion, reference numeral 31a denotes a multiplier-factor-variable multiplier, reference numeral 34a denotes an enable-provided accumulator, and reference numeral 35 denotes is an adder. The control signal generating portion 30a outputs a pulse at the Hi level as a control signal F for one clock cycle at the time when the completion of frequency pull-in is detected based on a phase error signal E output from the phase comparator 20. The multiplier-factor-variable multiplier 31a outputs a result obtained by multiplying the phase error signal E by a first filter coefficient α1 for a period during which the control signal F is not output, and a result obtained by multiplying the phase error signal E by a second filter coefficient α2 after the control signal F is output. The enable-provided accumulator 34a accumulates a constant value 0 for a period during which the control signal F is not output, and after the control signal F is output, accumulates outputs G from the multiplier-factor-variable multiplier 31a, and outputs a result. The adder 35 adds the output G from the multiplier-factor-variable multiplier 31a and the output Y from the enable-provided accumulator 34a. A digital value representing the result of this addition, namely, a filter output Z, is supplied to the VFO 23 via the D/A converter 22.

According to the configuration of FIG. 10, during the frequency pull-in operation, the control signal F output from the control signal generating portion 30a is at the Lo level, so that the output Y from the enable-provided accumulator 34a is 0. Assuming that the phase error at an arbitrary time j during the frequency pull-in operation is E(j), the filter output Z is expressed by:

$$Z=G+Y=\alpha 1\times E(j)$$

When the frequency pull-in is completed and the frequency lock state (E=constant) is reached, the control signal generating portion 30a outputs a pulse at the Hi level as the control signal F. Assuming that the phase error in this frequency lock state is E(k), the output G from the multiplier-factor-variable multiplier 31a is α1×E(k) representing a frequency correction component. The enable-provided accumulator 34a stores the frequency correction component α1×E(k) in response to the control signal F and then starts accumulating. From this point, a phase pull-in operation is started.

Assuming that the phase error at an arbitrary time m during the phase pull-in operation is E(m), the filter output Z is expressed by:

$$Z=G+Y=\alpha 2\times E(m)+\alpha 1\times E(k)+\Sigma_{n-k+1}^{m}\{\alpha 2\times E(n)\}$$

In this case, the phase pull-in operation is started, using the frequency correction component α1×E(k) collectively stored in the enable-provided accumulator 34a, so that high-speed phase pull-in can be attained.

Figure 11:
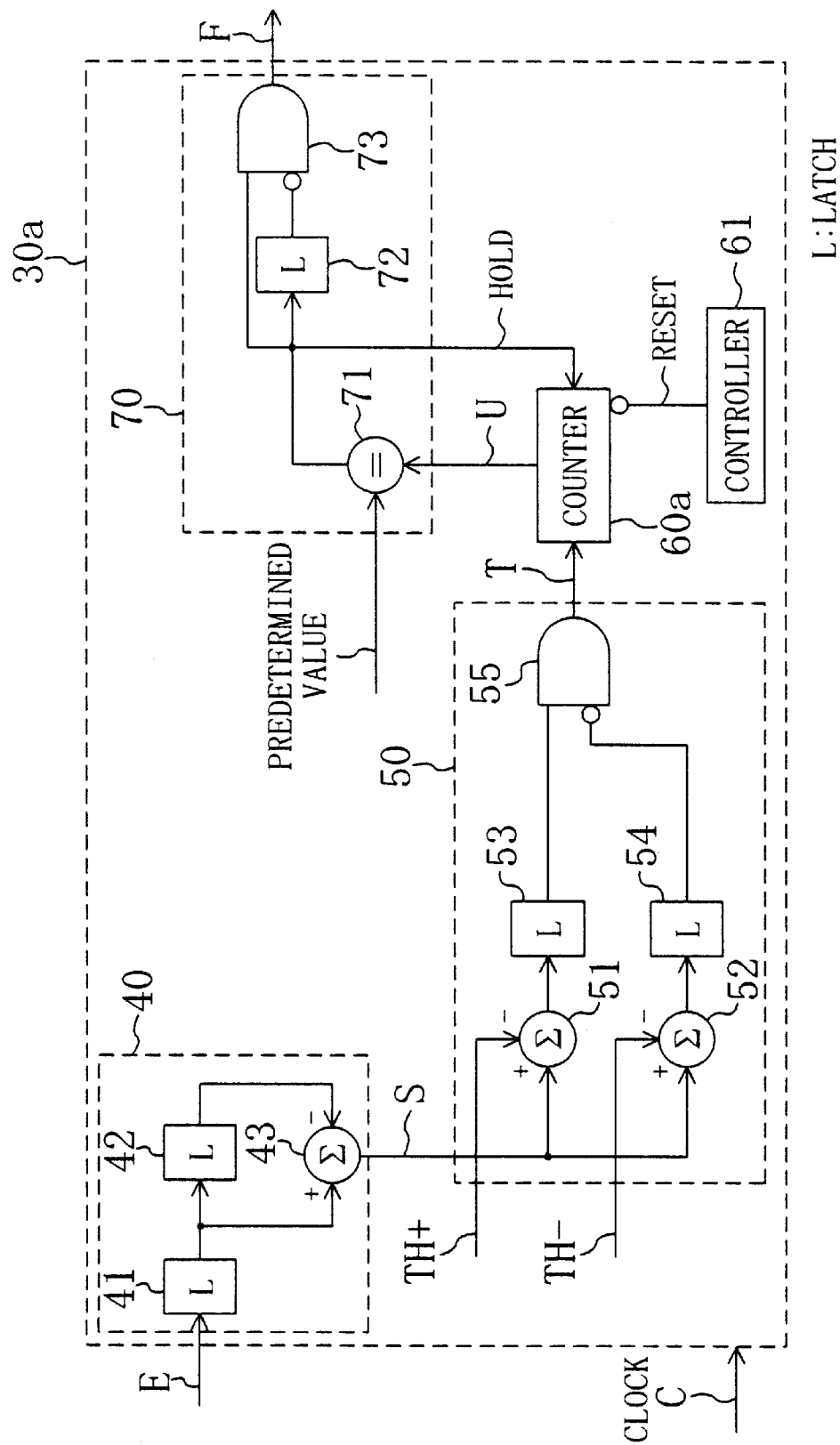
FIG. 11 is a circuit diagram showing the control signal generating portion in FIG. 10 in detail.

FIG. 11 shows a configuration example of the control signal generating portion 30a in FIG. 10 in detail. The configuration of FIG. 11 is different from that of FIG. 4 in that the counter 60 in FIG. 4 is replaced by a reset-provided counter 60a, and a controller 61 is added. The controller 61 is means for resetting the count of the counter 60a to 0 when it is confirmed that frequency pull-in is required again during the phase pull-in operation. Even if a frequency error is generated by, for example external disturbances during the phase pull-in operation, resetting of the counter 60a by the controller 61 after a predetermined numbers of clock cycles have passed makes it possible to return from the phase pull-in operation to the frequency pull-in operation immediately.

The configurations of the control signal generating portions 30 in FIGS. 3, 6 and 8 can be changed to the configuration of FIG. 11.

Figure 12:
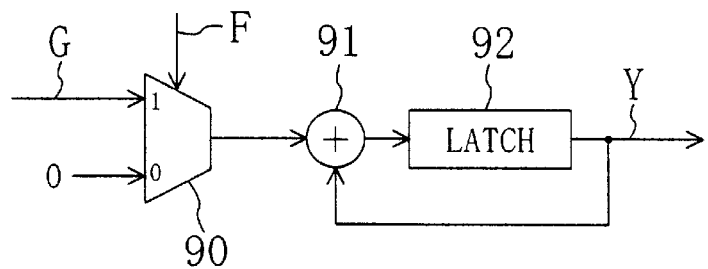
FIG. 12 is a circuit diagram showing the enable-provided accumulator in FIG. 10 in detail.

FIG. 12 shows a configuration example of the enable-provided accumulator 34a in FIG. 10. In FIG. 12, reference numeral 90 denotes a selector, reference numeral 91 denotes an adder and reference numeral 92 denotes a latch. The selector 90 supplies a constant value 0 for a period during which the control signal F is not output, and supplies the output G from the multiplier-factor-variable multiplier 31a after the control signal F is output, to the adder 91. The adder 91 adds the output from the selector 90 and the output from the latch 92. The value stored in the latch 92 is updated to the result of this addition. More specifically, the enable-provided accumulator 34a in FIG. 12 accumulates only the outputs G from the multiplier-factor-variable multiplier 31a after the control signal F is output.

Fifth Configuration Example

Figure 13:
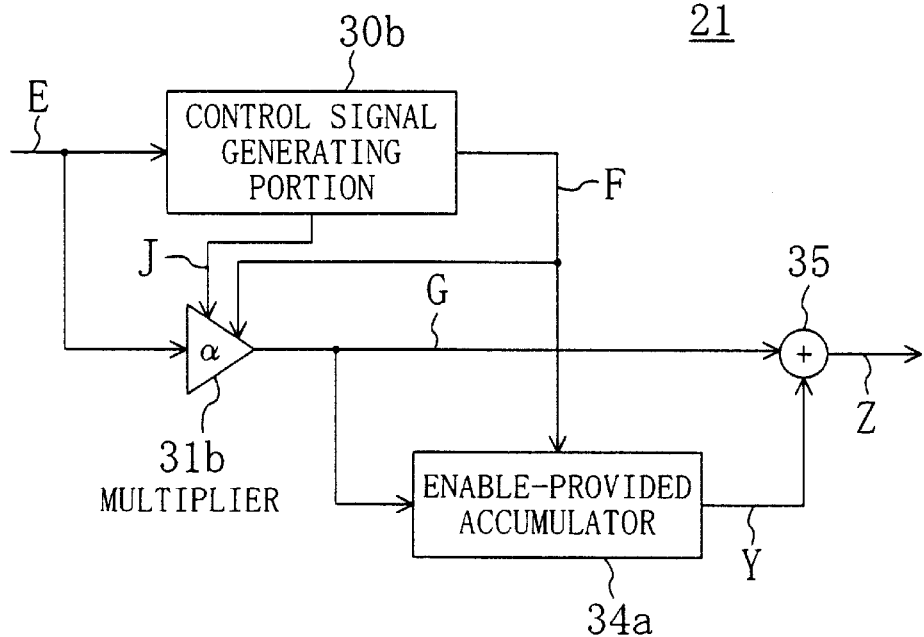
FIG. 13 is a block diagram showing a fifth example of the configuration of the loop filter in FIG. 2.

FIG. 13 shows a fifth configuration example of the loop filter 21 in the FIG. 2. The configuration in FIG. 13 is different from that of FIG. 10 in that the control signal generating portion 30a and the multiplier-factor-variable multiplier 31a in FIG. 10 are provided further with a multiplier factor switching function. The control signal generating portion 30b in FIG. 13 has a function for activating and outputting a multiplier factor switching signal J when a phase inversion is detected from the phase error signal E during the frequency pull-in operation, in addition to a function for outputting a pulse at the Hi level as a control signal F at the time when the completion of frequency pull-in is detected based on the phase error signal E. The multiplier-factor-variable multiplier 31b in FIG. 13 is configured so as to multiply the phase error signal E by a first filter α1 for a period during which the control signal F is not output under the condition that the multiplier factor switching signal J is not activated, a second filter coefficient α2 after the control signal F is output, and a third filter coefficient α3 when the activated multiplier factor switching signal J is received. In other words, when the control signal generating portion 30b detects a phase inversion during the frequency pull-in operation, the filter coefficient of the multiplier-factor-variable multiplier 31b is changed to α3 so that the frequency lock is attained.

Figure 14:
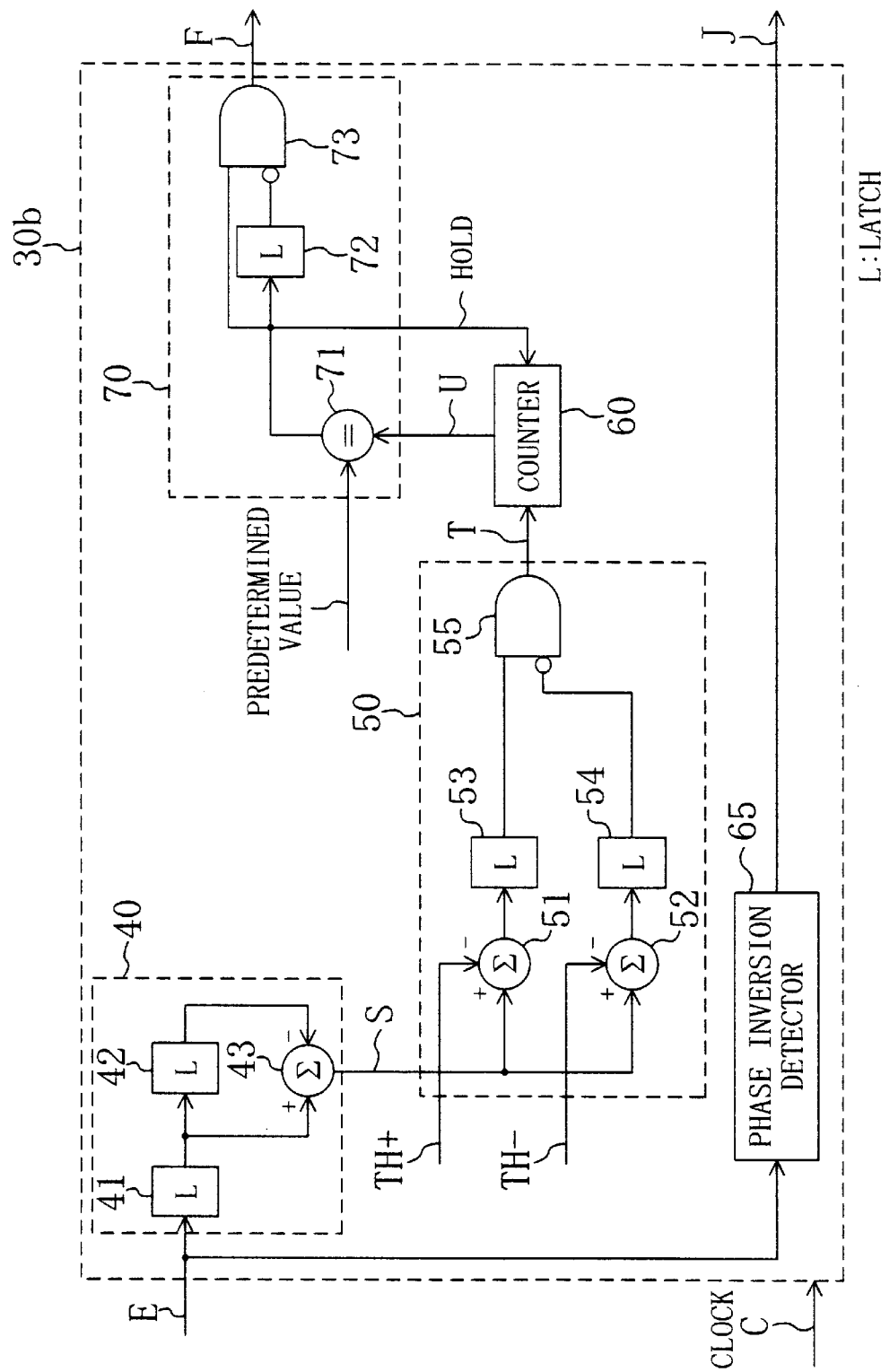
FIG. 14 is a circuit diagram showing the control signal generating portion in FIG. 13 in detail.

FIG. 14 is a configuration example of the control signal generating portion 30b in FIG. 13 in detail. The configuration of FIG. 14 is different from that of FIG. 4 in that a phase inversion detector 65 is added.

When the loop gain in the clock recovery circuit 17 during the frequency pull-in operation is too small, a significant frequency error occurs, and thus the frequency pull-in cannot be attained. In this case, a so-called "phase inversion" occurs, where a phase error from a positive or a negative value having a large absolute value to a negative or a positive value having a large absolute value. For example, when the frequency error is positive (the oscillating clock frequency of the VFO 23 is too high), a phase inversion from negative to positive occurs. When the frequency error is negative, a phase inversion from positive to negative occurs. The phase inversion detector 65 in FIG. 14 detects such a phase inversion. When a phase inversion is detected, the loop gain is changed by changing the filter coefficient of the multiplier-factor-variable multiplier 31b in FIG. 13 to α3, and thus the frequency pull-in can be attained reliably.

The same configuration change as the change from FIG. 10 to FIG. 13 can be made with respect to the loop filters 21 of FIGS. 3, 6, and 8.

Sixth Configuration Example

Figure 15:
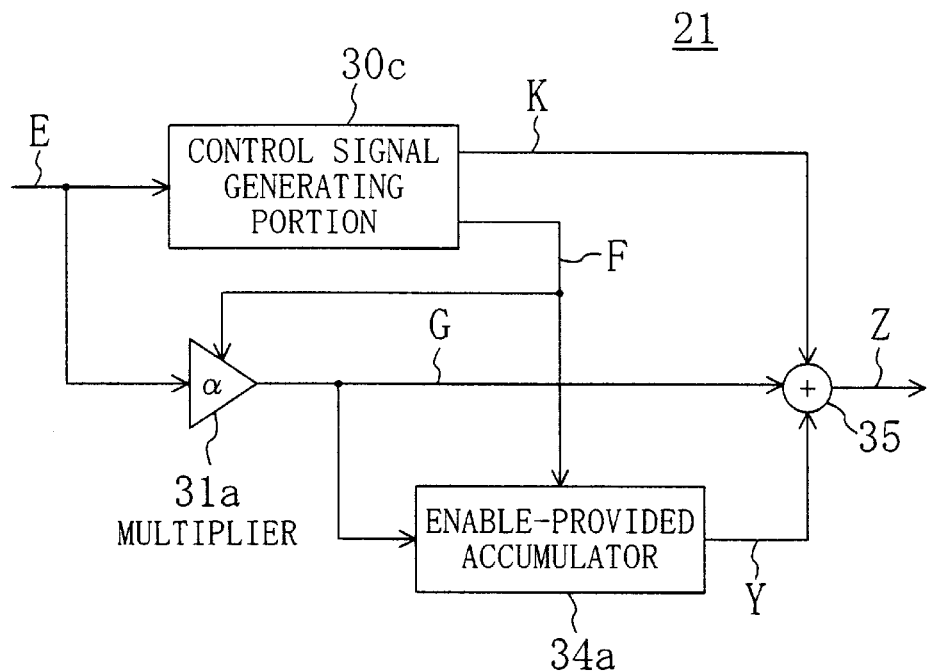
FIG. 15 is a block diagram showing a sixth example of the configuration of the loop filter in FIG. 2.
Figure 17:
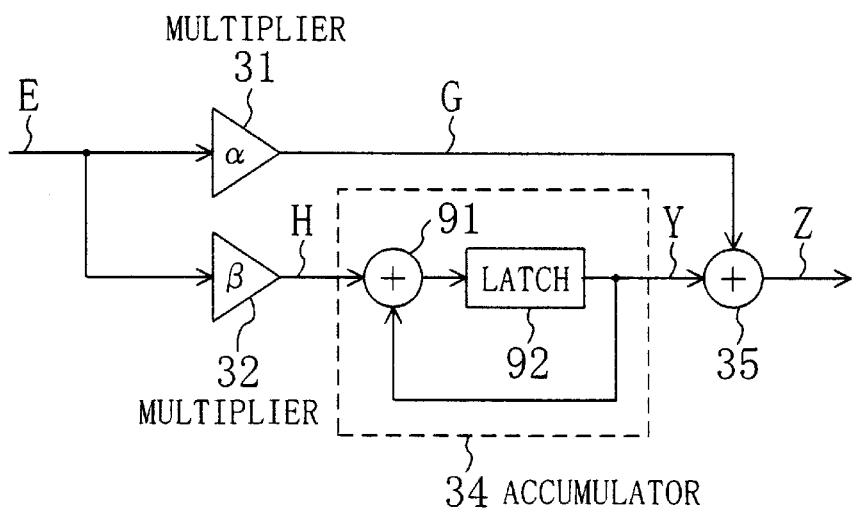
FIG. 17 is a block diagram showing an example of the configuration of a conventional loop filter.

FIG. 15 shows a sixth configuration example of the loop filter 21 in the FIG. 2. The configuration in FIG. 15 is different from that of FIG. 10 in that the control signal generating portion 30a and the adder 35 in FIG. 10 are provided further with an offset adjusting function. The control signal generating portion 30c in FIG. 15 has a function for outputting an offset signal K when a phase inversion is detected from the phase error signal E during the frequency pull-in operation, in addition to a function for outputting a pulse at the Hi level as a control signal F at the time when the completion of frequency pull-in is detected based on the phase error signal E. The adder 35 in FIG. 15 adds the output G from the multiplier-factor-variable multiplier 31a, the output Y from the enable-provided accumulator 34a, and the offset K from the control signal generating portion 30c. The digital value representing the result of this addition is the filter output Z. In other words, when the control signal generating portion 30c detects a phase inversion during the frequency pull-in operation, the offset signal K is supplied to the adder 35 so that the frequency lock is attained.

Figure 16:
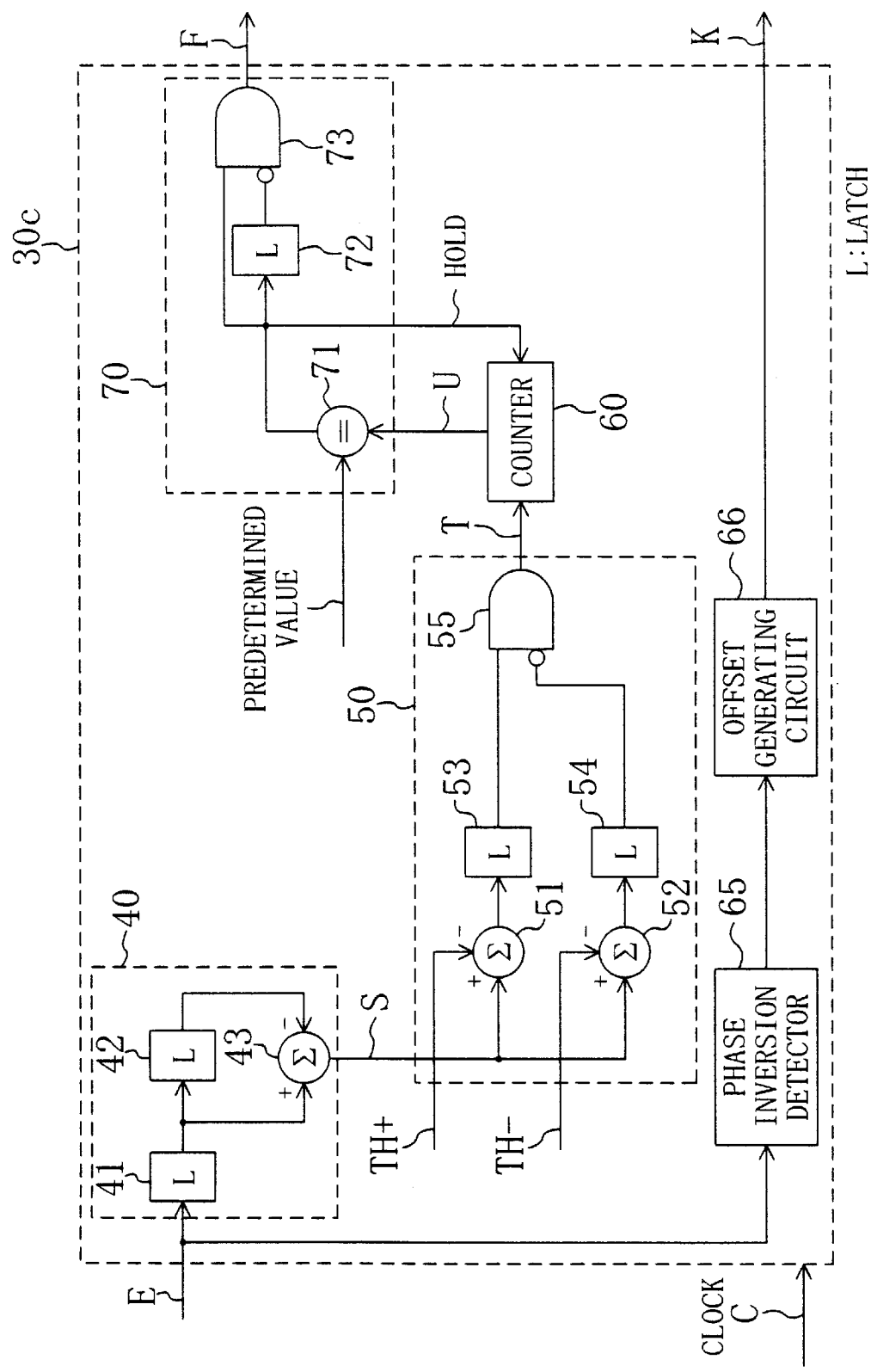
FIG. 16 is a circuit diagram showing the control signal generating portion in FIG. 15 in detail.
Figure 18:
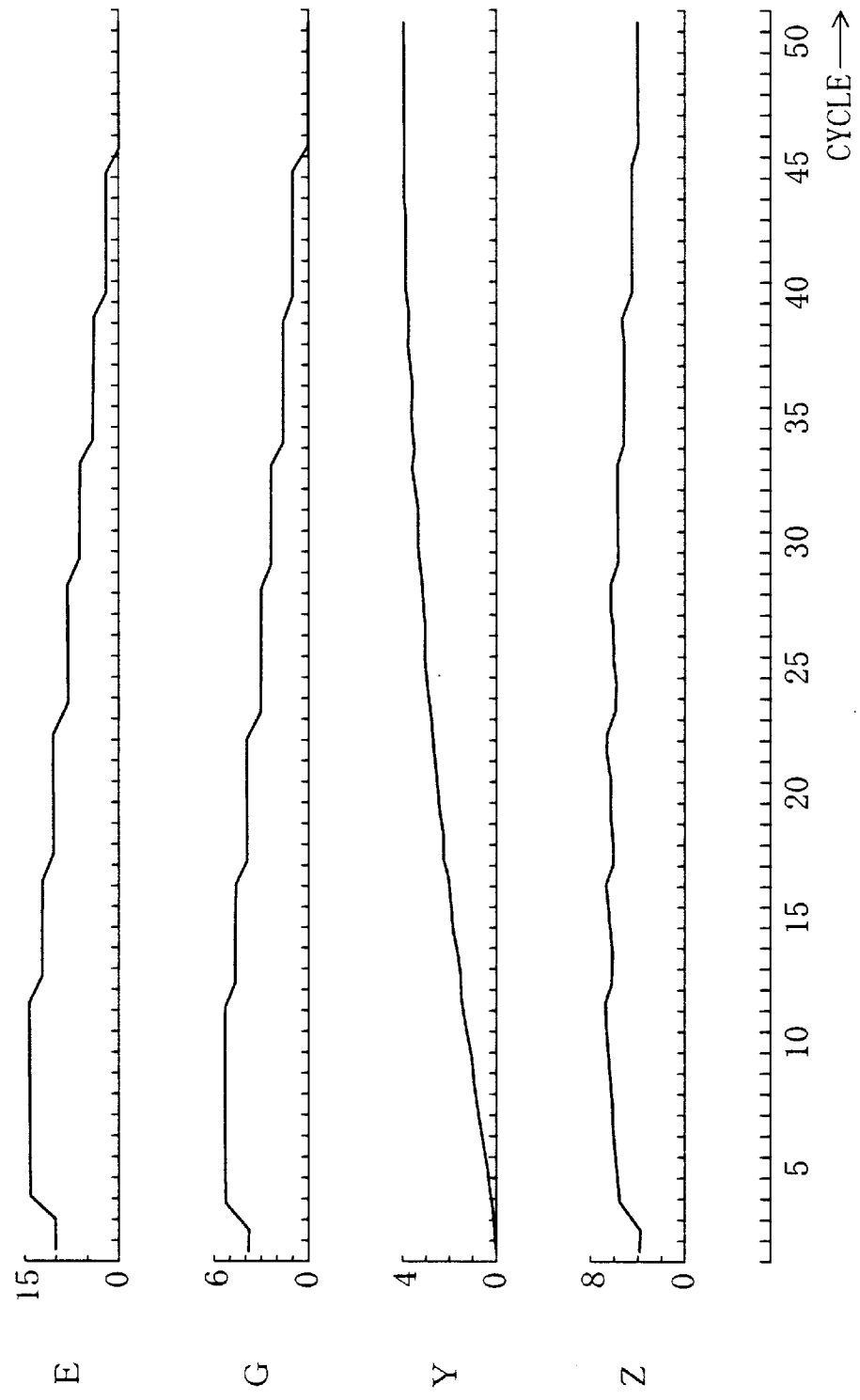
FIG. 18 is a waveform diagram showing an example of the operation of the loop filter of FIG. 17.

FIG. 16 is a configuration example of the control signal generating portion 30c in FIG. 15 in detail. The configuration of FIG. 16 is different from that of FIG. 4 in that a phase inversion detector 65 and an offset generating circuit 66 are added. The phase inversion detector 65 detects a phase inversion from the phase error signal E. When a phase inversion is detected, the offset generating circuit 66 supplies the offset signal K to the adder 35, and thus the frequency pull-in can be attained reliably.

The same configuration change as the change from FIG. 10 to FIG. 15 can be made with respect to the loop filters 21 of FIGS. 3, 6, and 8.

The invention may be embodied in other forms without departing from the spirit or essential characteristics thereof.

The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A clock recovery circuit for reproducing a clock signal synchronized with an input signal quantized to a digital value from the input signal, comprising:

an oscillator for generating an oscillating clock signal of a variable frequency;

a phase comparator for computing a digital value representing a phase error of the oscillating clock signal with respect to the input signal and outputting a result;

a loop filter for smoothing a digital output from the phase comparator and outputting the smoothed digital output; and a converter for converting the digital output from the loop filter to an analog voltage and supplying the analog voltage to the oscillator so as to control generation of the oscillating clock signal so that the phase error is 0, the loop filter comprising:

first and second multipliers for multiplying the digital output from the phase comparator by respective filter coefficients and outputting results;

a control signal generating portion for outputting a control signal at a time when completion of frequency pull-in is detected based on the digital output from the phase comparator;

an enable-provided latch for outputting a constant value 0 for a period during which the control signal is not output, and after the control signal is output, storing an output from the first multiplier at the time when the control signal is output, and outputting the same;

an accumulator for accumulating outputs from the second multiplier and outputting a result; and an adder for supplying a digital value representing a result of addition of an output from the first multiplier, an output from the enable-provided latch, and an output from the accumulator to the converter, wherein a phase pull-in operation is started using the stored value of the output from the first multiplier at a time of completion of the frequency pull-in.

2. The clock recovery circuit according to claim 1, wherein the oscillating clock signal is used for sampling for quantization of the input signal.

3. The clock recovery circuit according to claim 1, wherein the loop filter further comprises a selector for supplying a constant value 0 for a period during which the control signal is not output, and supplying the digital output from the phase comparator after the control signal is output, to the second multiplier.

4. The clock recovery circuit according to claim 1, wherein each of the first and the second multipliers is configured so as to multiply the digital output from the phase comparator by a first filter coefficient for a period during which the control signal is not output, and multiply the same by a second filter coefficient after the control signal is output.

5. The clock recovery circuit according to claim 1, wherein the control signal generating portion comprises:

a difference calculator for calculating a change in the digital output from the phase comparator and outputting a result;

a window comparator for outputting a count signal when the change is in a certain range;

a counter for counting the count signal; and a pulse generator for generating a pulse signal upon determination that frequency pull-in is completed at a time when an output from the counter reaches a predetermined value and outputting the generated pulse signal as the control signal.

6. The clock recovery circuit according to claim 5, wherein the control signal generating portion has means for resetting a count of the counter when it is confirmed that frequency pull-in is required again during a phase pull-in operation.

7. The clock recovery circuit according to claim 1, wherein the control signal generating portion has means for changing a filter coefficient of the first multiplier so that frequency lock is attained when a phase inversion is detected from the digital output from the phase comparator during a frequency pull-in operation.

8. The clock recovery circuit according to claim 1, wherein the control signal generating portion has means for supplying an offset to the adder so that frequency lock is attained when a phase inversion is detected from the digital output from the phase comparator during a frequency pull-in operation.

9. A clock recovery circuit for reproducing a clock signal synchronized with an input signal quantized to a digital value from the input signal, comprising:

an oscillator for generating an oscillating clock signal of a variable frequency;

a phase comparator for computing a digital value representing a phase error of the oscillating clock signal with respect to the input signal and outputting a result;

a loop filter for smoothing a digital output from the phase comparator and outputting the smoothed digital output; and a converter for converting the digital output from the loop filter to an analog voltage and supplying the analog voltage to the oscillator so as to control generation of the oscillating clock signal so that the phase error is 0, the loop filter comprising:

a control signal generating portion for outputting a control signal at a time when completion of frequency pull-in is detected based on the digital output from the phase comparator;

a multiplier for outputting a result obtained by multiplying the digital output from the phase comparator by a first filter coefficient for a period during which the control signal is not output, and after the control signal is output, multiplying the digital output from the phase comparator by a second filter coefficient;

an enable-provided accumulator for accumulating a constant value 0 for a period during which the control signal is not output, and accumulating outputs from the multiplier after the control signal is output and outputting a result; and an adder for supplying a digital value representing a result of addition of an output from the multiplier and an output from the enable-provided accumulator to the converter, wherein a phase pull-in operation is started using a stored value of an output from the multiplier at a time of completion of the frequency pull-in.

10. The clock recovery circuit according to claim 9, wherein the oscillating clock signal is used for sampling for quantization of the input signal.

11. The clock recovery circuit according to claim 9, wherein the control signal generating portion comprises:

a difference calculator for calculating a change in the digital output from the phase comparator and outputting a result;

a window comparator for outputting a count signal when the change is in a certain range;

a counter for counting the count signal; and a pulse generator for generating a pulse signal upon determination that frequency pull-in is completed at a time when an output from the counter reaches a predetermined value and outputting the generated pulse signal as the control signal.

12. The clock recovery circuit according to claim 11, wherein the control signal generating portion has means for resetting a count of the counter when it is confirmed that frequency pull-in is required again during a phase pull-in operation.

13. The clock recovery circuit according to claim 9, wherein the control signal generating portion has means for changing a filter coefficient of the multiplier so that frequency lock is attained when a phase inversion is detected from the digital output from the phase comparator during a frequency pull-in operation.

14. The clock recovery circuit according to claim 9, wherein the control signal generating portion has means for supplying an offset to the adder so that frequency lock is attained when a phase inversion is detected from the digital output from the phase comparator during a frequency pull-in operation.

* * * * *